United States Patent [19]

Eichelberger et al.

[11] 4,138,666

[45] Feb. 6, 1979

[54] CHARGE TRANSFER CIRCUIT WITH THRESHOLD VOLTAGE COMPENSATING MEANS

[75] Inventors: Charles W. Eichelberger, Schenectady; Walter J. Butler, Scotia, both of N.Y.

[73] Assignee: General Electric Company, Schenectady, N.Y.

[21] Appl. No.: 852,233

[22] Filed: Nov. 17, 1977

[51] Int. Cl.² ............................................. H03K 13/09
[52] U.S. Cl. ...................... 340/347 CC; 340/347 AD; 340/347 NT; 307/221 D; 357/24
[58] Field of Search ............... 340/347 AD, 347 NT, 340/347 M, 347 CC; 307/221 D, 251, 246; 357/24; 328/165

[56] References Cited

U.S. PATENT DOCUMENTS

| | | |
|---|---|---|
| 3,414,807 | 12/1968 | Evans .............................. 340/347 NT |
| 3,737,683 | 6/1973 | Sangster .......................... 307/221 D |
| 3,986,176 | 10/1976 | Weimer ............................ 307/221 D |
| 4,070,667 | 1/1978 | Eichelberger ................ 340/347 AD |
| 4,074,260 | 2/1978 | Butler ............................ 340/347 AD |

Primary Examiner—Charles D. Miller
Attorney, Agent, or Firm—Geoffrey H. Krauss; Joseph T. Cohen; Marvin Snyder

[57] ABSTRACT

A charge transfer circuit of the type including first and second capacitors and a charge transfer transistor for transferring discrete packets of charge from the first to the second capacitor is disclosed. The charge transfer circuit includes a feedback circuit which recharges the first capacitor to a value which varies as a function of the threshold voltage of the charge transfer transistor. As a result, the magnitude of the charge packets transferred by the charge transfer remain at a predetermined value irrespective of variations in the threshold voltage of the transistor.

10 Claims, 3 Drawing Figures

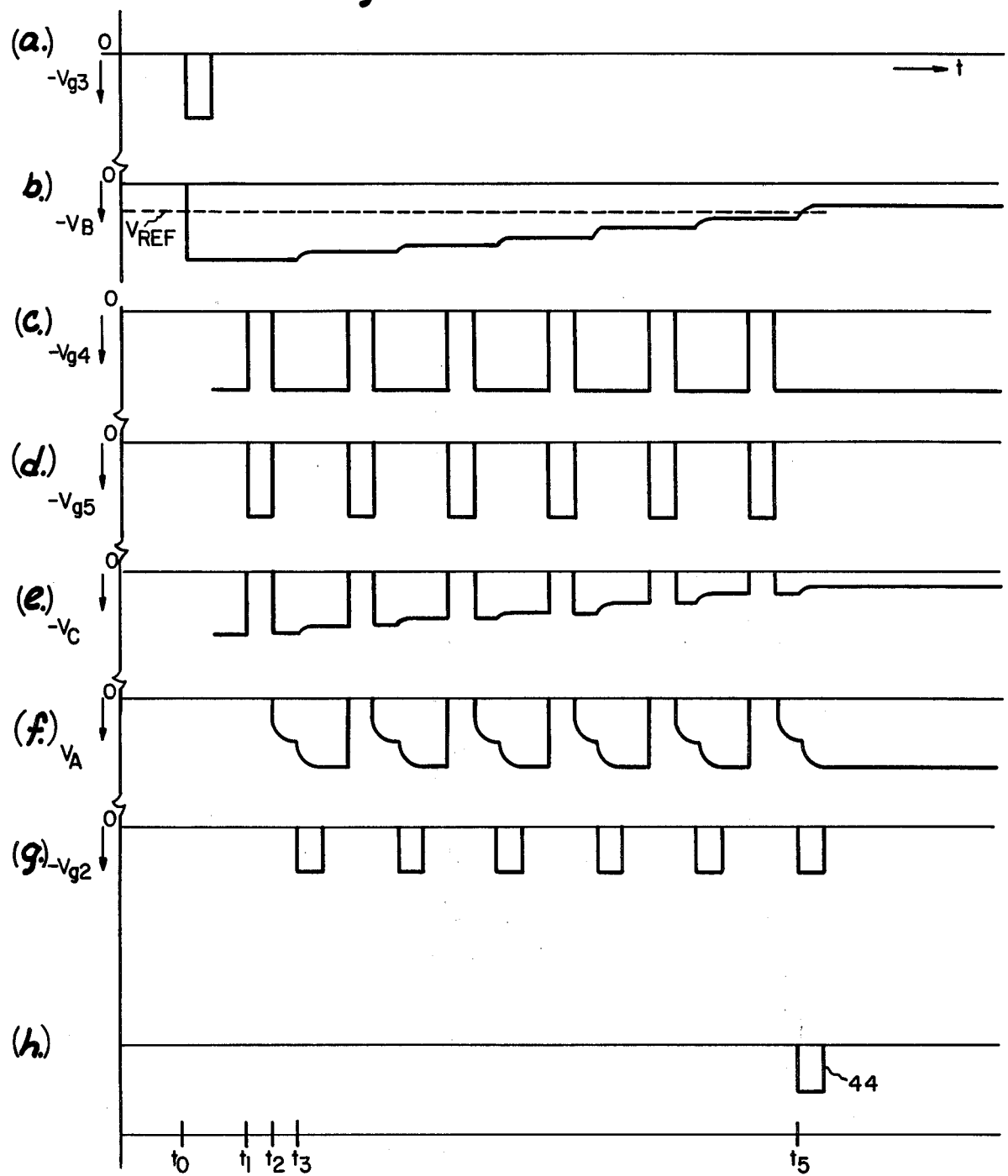

4,138,666

CHARGE TRANSFER CIRCUIT WITH THRESHOLD VOLTAGE COMPENSATING MEANS

BACKGROUND OF THE INVENTION

The present invention is related to charge transfer circuits of the type comprising first and second capacitors and a charge transfer transistor for transferring a plurality of discrete charge packets from the first to the second capacitor. Charge transfer circuits of the foregoing type are particularly useful in monolithic analog to digital converters such as those described in U.S. Patent Application Ser. No. 628,542, filed Nov. 3, 1975, and assigned to the assignee of the present application. Exemplary of several other applications of such circuits in U.S. Pat. No. 3,819,954, which discloses a charge transfer delay line circuit.

While the uses of charge transfer circuits are varied, a common requirement of charge transfer analog to digital converters is that an equal amount of charge be transferred from the first to the second capacitor during each charge transfer operation. In applications of this type, a signal proportional to the analog voltage being converted is applied to the second capacitor. During each of the plurality of charge transfer operations, a metered charge packet, having a constant magnitude, is transferred to the second capacitor. Since the magnitude of each metered charge packet is ideally constant, the number of charge packets required to change the voltage across the second capacitor from the first proportional to the analog voltage to be converted to second predetermined value is ideally proportional to the magnitude of the analog signal being converted.

The foregoing relationship is modified in actual application by two variables: (1) a thermally induced leakage current in the semi-conductor substrate in which the first and second capacitors and the charge transfer transistor are preferably formed; and (2) the threshold voltage of the transistor. Various circuits have been proposed to compensate for variations in the thermally induced leakage current which would normally modify the size of the charge packets. The present application is directed towards an apparatus for preventing any variations in the size of the charge packet due to variations in the threshold voltage of the charge transfer transistor.

When a MOSFET is operated in a "shelf" mode, its source is isolated, and when the transistor turns on, charge flows from its source to its drain until the voltage at its source becomes equal to its gate voltage less its threshold voltage. This feature of a MOSFET transistor makes it suitable for use as a charge transfer transistor for transferring a discrete packet of charge from a first capacitor located at its source to a second capacitor located at its drain. Particularly, each time the MOSFET is biased into the "shelf" mode, a discrete packet of charge ΔQ is transferred from the first to the second capacitor in accordance with the following formula:

$$\Delta Q = C(V_g - V_t - V_c) \quad (1)$$

wherein C is the capacitance of the first capacitor, $V_g$ is the gate voltage of the transistor, $V_t$ is the threshold voltage of the transistor and $V_c$ is the voltage across the first capacitor at the initiation of the charge transfer operation. It is apparent from equation (1) that any changes in the threshold voltage $V_t$ will result in variations in the size of the metered charge packet transferred from the first to the second capacitor.

The magnitude of the threshold voltage $V_t$ of a MOSFET can vary both as a function of the temperature of the MOSFET and of the magnitude of the drain voltage. Accordingly, if these parameters are not properly taken into account, the magnitude of the threshold voltage, and therefore the magnitude of the charge packets, can vary during each use of the charge transfer circuit. Such a result is clearly undesirable since it would degrade the presumed linear relationship between the magnitude of the analog voltage being converted and the number of charge packets required to change the charge across the second capacitor from the first value representative of the analog voltage and the second predetermined value.

SUMMARY OF THE INVENTION

In an effort to overcome the foregoing problems, the present invention utilizes a feedback circuit for recharging the first capacitor to a value which varies from a predetermined value by an amount substantially equal to the threshold voltage of the MOSFET after each charge transfer operation. By so recharging the first capacitor, the size of the charge packet is made independent of any variations in the magnitude of the threshold voltage of the MOSFET.

BRIEF DESCRIPTION OF THE DRAWINGS

For the purpose of illustrating the invention, there is shown in the drawings several embodiments which are presently preferred; it being understood, however, that this invention is not limited to the precise arrangements and instrumentalities shown.

FIG. 3 is a series of graphs illustrating the voltage at various points in the circuit of FIG. 1.

DETAILED DESCRIPTION OF THE INVENTION

Figure 1:
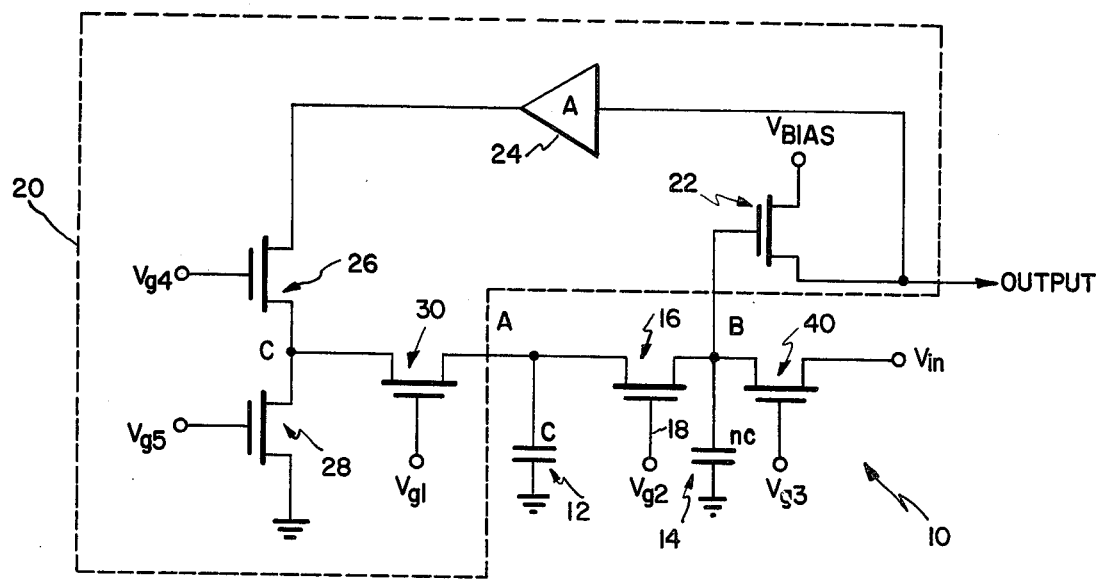
FIG. 1 is a circuit diagram of a charge transfer circuit constructed in accordance with the principles of the present invention.

Referring now to the drawings, wherein like numerals indicate like elements, there is shown in FIG. 1 a charge transfer circuit constructed in accordance with the principles of the present invention and designated generally as 10. Charge transfer circuit 10 is preferably a monolithic device which comprises a first charge storage capacitor 12, a second charge storage capacitor 14 and a charge transfer transistor 16 coupled therebetween. Charge transfer transistor 16 is, in this embodiment, a p-channel MOSFET which receives a plurality of clock pulses $V_{g2}$ at its gate terminal 18, each of which clock pulses causes the transistor 16 to transfer a metered charge packet from the first capacitor 12 to the second capacitor 14. When a gate voltage of sufficient magnitude $V_{g2}$ is applied, transistor 16 is operated in a "shelf" mode wherein transistor 16 will turn on and remain on until the voltage at its source (node A) falls to a value equal to its gate voltage less its threshold voltage. As a result of the foregoing operation, each time a gating pulse is applied to gate terminal 18 of transistor 16, transistor 16 transfers a discrete packet of charge $Q_i$ from node A to node B in accordance with the following formula:

$$Q_i = (V_{g2} - V_{t2} - V_A) C \qquad (2)$$

wherein $V_{g2}$ is the gate voltage applied to transistor 16, $V_{t2}$ is the threshold voltage of transistor 16, $V_A$ is the voltage at node A at the initiation of a charge transfer operation and C is the capacitance of capacitor 12.

It is clear from the foregoing, that any variations in the magnitude of the threshold voltage $V_{t2}$ will vary the size of the charge packets delivered to capacitor 14. In an effort to avoid this undesirable result, the present invention utilizes a feedback circuit 20 to recharge capacitor 12 to a value:

$$V_A = V_k - V_{t1} \qquad (3)$$

(wherein $V_k$ is a constant value and $V_{t1}$ is the threshold voltage of transistor 30) after each charge transfer operation. Substituting equation (3) into equation (2) the size of each charge packet becomes:

$$Q_i = [V_{g2} - V_{t2} - (V_k - V_{t1})]C = V_{g2} - V_k, \text{ when}$$
$$V_{t2} = V_{t1}. \qquad (4)$$

Accordingly, by recharging capacitor 12 to a value which varies from a constant value $V_k$ by an amount equal to the threshold voltage of transistor 30, the magnitude of the charge packet $Q_i$ transferred from node A to node B is essentially independent of any variations of the threshold voltages of the transistors In the embodiment illustrated in FIG. 1, feed-back circuit 20 recharges capacitor 12 to a value which varies from a predetermined value by an amount approximately equal to $V_{t1}$ after each charge transfer operation.

Feedback circuit 20 comprises a voltage follower 22, an amplifier 24, switching transistors 26 and 28 and a charge transfer transistor 30. Voltage follower 22 is provided to isolate the charge transfer circuit from the output circuit to which it is connected. The amplifier 24 compensates for any voltage offset generated by voltage follower 22 in order that the voltage applied to transistor 26 will be substantially identical to the voltage at node B. Transistor 26 is biased to operate in the "switching" mode and applies the voltage appearing at node B to node C whenever a gating pulse $V_{g4}$ is applied to its gate input. Transistor 28 is also biased to operate in the "switching" transistor mode and grounds node C whenever a gating pulse $V_{g5}$ is applied thereto. As will be shown below, gating signals $V_{g4}$ and $V_{g5}$ are complementary signals and may be derived from a single gating pulse with the use of an inverter. Transistor 30 is preferably a p channel MOSFET transistor which is formed in the same substrate as transistor 16. For reasons which will become apparent below, the electrical characteristics of transistor 30 are preferably substantially identical to those of transistor 16. The gate voltage $V_{g1}$ applied to transistor 30 is constant. Transistor 30 is alternately biased into the "switching" transistor mode and the "shelf" transistor mode when transistors 28, 26 are gated on, respectively. When transistor 28 is gated on, node C is grounded and transistor 30 is biased into the "switching" transistor mode. In this mode, the voltage at node A equalizes with that at node C driving node A to ground. When transistor 26 is switched on (and transistor 26 off), node C is raised to a value substantially equal to that at node B. The parameters of the voltages biasing transistor 30 are so chosen that when node C is raised to $V_B$ volts, transistor 30 is placed in a "shelf" mode with node A acting as the source of the transistor 30. In this mode, current flows from node A to node C until the voltage at node A drops to a value $$V_A = V_{g1} - V_{t1} \qquad (5)$$

wherein $V_{g1}$ is the constant gate voltage applied to transistor 30 and $V_{t1}$ is the threshold voltage thereof. As will become clear from the following description of the operation of circuit 10, the threshold voltage $V_{t1}$ of transistor 30 is substantially equal to that of transistor 16 such that the requirements of equation (5) are met.

To better understand the operation of the circuit of FIG. 1, reference will be made to FIGS. 2 and 3. In the following description, it is assumed that the charge transfer circuit is utilized in connection with an analog to digital converter circuit 32. It should be recognized, however, that the charge transfer circuit of the present invention may be utilized in several other applications and is not limited to use in the analog to digital converter. Additionally, it is assumed that the charge transfer circuit of FIG. 10 is formed using p channel MOSFETs. The use of n channel MOSFET would, however, also fall within the scope of the present invention.

Figure 2:
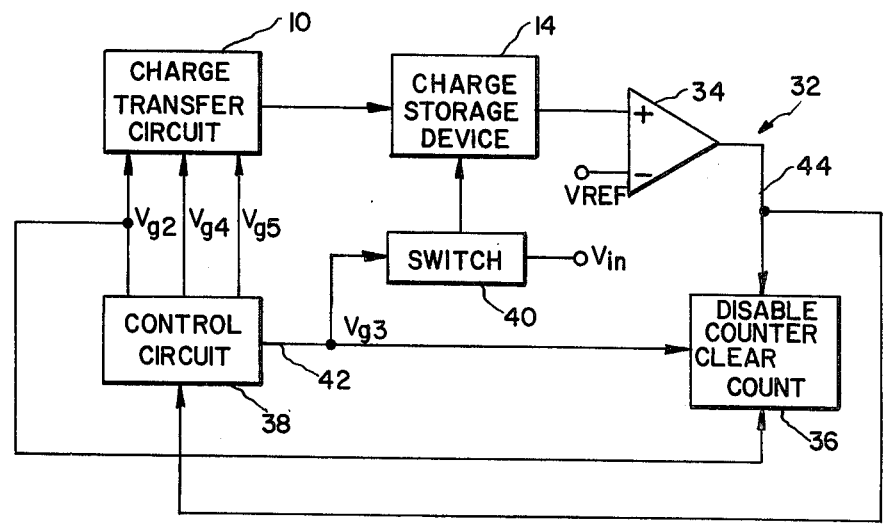
FIG. 2 is a block diagram of a digital to analog converter circuit utilizing the charge transfer circuit of FIG. 1.

The analog to digital converter circuit of FIG. 2 includes a charge transfer circuit 10, a charge storage device 14, a comparator 34, a counter 36, a control circuit 38 and an electronic switch 40. At the initiation of a charge storage operation, control circuit 38 generates an output pulse $V_{g3}$ on line 42. This output pulse is illustrated in waveform (a) of FIG. 3 and is applied to the clear input of counter 36 and to switch 40. As a result, the count in counter 36 resets to zero and electronic switch 40 applies a voltage $-V_{in}$ to the charge storage device 14. Voltage $-V_{in}$ is representative of the analog signal to be converted. As shown in FIG. 1, switch 40 may be a MOSFET formed in the same substrate as transistors 16 and 30. The resultant voltage across node B is illustrated in the waveform (b) of FIG. 3.

After the input voltage $-V_{in}$ has been applied to charge storage device 14, control circuit 38 causes charge transfer circuit 10 to apply a plurality of discrete charge packets to charge storage device 14. At time $t_1$, the gate voltage $V_{g5}$ will pulse low, turning on transistor 28 and grounding node C. In this condition, transistor 30 is biased into the "switching" node and mode A is grounded. See waveforms (d) and (e) of FIG. 3. At time $t_2$, transistor 28 turns off and transistor 26 turns on. See waveforms (c) and (d) of FIG. 3. The voltage at node C jumps to a value substantially equal to the voltage at node B and transistor 30 is biased into a "shelf" transistor mode. Since node C is more negative than node A, charge flows from node A to node C until the voltage across node A reaches a value $(V_{g1} - V_{t1})$. The voltage at node A remains at this value until time $t_3$ when transistor 16 is gated on. See waveform (g) of FIG. 3. The parameters of the circuit are so chosen that the voltage at node A is more positive than that at node B, causing charge to flow from node A to node B until the voltage at node A decreases to a value $(V_{g2} - V_{t2})$. See waveform (f) of FIG. 3. As a result, the size of the charge packet flowing fron node A to node B is:

$$Q_i = C[V_{g2} - V_{t2} - (V_{g1} - V_{t1})] \qquad (6)$$

As noted above, the electrical characteristics of transistors 16 and 30 are substantially identical. They are maintained at the same temperature since they are formed in the same substrate. By utilizing feedback circuit 20 to maintain the drain voltages of transistors 16 and 30 identical during their respective "shelf" modes of operation, their threshold voltages are also substantially identical. For this reason, equation (6) may be reduced to:

$$Q_i = C(V_{g2} - V_{g1}) \qquad (7)$$

As is clear from equation (7), the size of the charge packets $Q_i$ delivered by the charge transfer circuit 10 to the charge storage device 14 is a function of the relatively constant gate voltages $V_{g1}$ and $V_{g2}$ and is substantially independent of the threshold voltages of transistors 16 and 30.

Returning now to FIG. 2, the foregoing charge transfer sequence is repeated once during each charge transfer operation until the charge across charge storage device 14 is reduced to the reference value applied to the non-inverting input of comparator 34. When the charge across storage device 14 becomes equal to or less than the reference value $V_{ref}$, comparator 34 generates an output pulses (see waveform (h) of FIG. 3) on line 44 which is applied to the disable input of counter 36 and to the control circuit 38. The count in counter 36 will then provide a digital representation of the analog input voltage $V_{in}$ and therefore of the analog voltage being converted.

The present invention may be embodied in other specific forms without departing from the spirit or essential attributes thereof and, accordingly, reference should be made to the appended claims, rather than to the foregoing specification as indicating the scope of the invention.

What is claimed is:

1. A charge transfer circuit comprising:
   first and second charge storage capacitors;
   charge transfer circuit means, including a MOSFET coupled between said first and second charge storage capacitors, for transferring a discrete charge packet from said first to said second capacitor during each of a plurality of charge transfer operations, the magnitude of each said charge packet being a function of the magnitude of the voltage across said first capacitor just prior to each charge transfer operation and the magnitude of the threshold voltage of said MOSFET;
   feedback circuit means for recharging said first capacitor after each said charge transfer operation, the level to which said feedback circuit means charges said first capacitor varying from a predetermined value by an amount substantially equal to the threshold voltage of said MOSFET to cause the magnitude of each said charge packet to be substantially independent of any fluctuations in the magnitude of said threshold voltage.

2. The charge transfer circuit of claim 1, wherein said feedback circuit means comprises:
   a second MOSFET having substantially the same electrical characteristics as and maintained at substantially the same temperature as said charge transfer circuit MOSFET, said second MOSFET having a first terminal coupled to said first capacitor;
   means for biasing said second MOSFET into a "shelf" mode of operation such that said second MOSFET charges said first capacitor to a value $(V_g - V_t)$ after each said charge transfer operation, wherein $V_g$ is the gate voltage of said second MOSFET and $V_t$ is the threshold voltage thereof;
   said biasing means including means for adjusting the drain voltage of said second MOSFET to be substantially equal to the drain voltage of said charge transfer circuit MOSFET whenever said biasing means biases said second MOSFET into said "shelf" mode of operation whereby the threshold voltage $V_t$ of said second MOSFET is substantially equal to the threshold voltage of said charge transfer circuit MOSFET.

3. The charge transfer circuit of claim 2, wherein said charge transfer circuit MOSFET and said second MOSFET are formed in a single semi-conductor substrate.

4. The charge transfer circuit of claim 2, wherein said gate voltage is chosen to be more negative than the sweep of the voltage across said first capacitor and wherein said biasing means biases said second MOSFET into said "shelf" transistor mode by first precharging said first capacitor to a value which is more positive than said drain voltage of said charge transfer MOSFET and then adjusting the drain voltage of said second MOSFET to be substantially equal to the drain voltage of said charge transfer circuit MOSFET.

5. An analog to digital converter, comprising:
   (1) a first charge storage device;
   (2) means for charging said first charge storage device to a first value representative of an analog signal to be converted;
   (3) a charge transfer circuit comprising:
      (a) a second charge storage device;
      (b) a MOSFET coupled between said first and second charge storage devices for transferring a discrete charge packet from said second to said first charge storage device during each of a plurality of charge transfer operations, the magnitude of each said charge packet being a function of the magnitude of the voltage across said second charge storage device just prior to each said charge transfer operation and the magnitude of the threshold voltage of said MOSFET;
      (c) feedback circuit means for recharging said second charge storage device after each said charge transfer operation, the level to which said feedback circuit means charges said second charge storage device varying from a predetermined value by an amount substantially equal to the threshold voltage of said MOSFET to cause the magnitude of each said charge packet to be substantially independent of any fluctuations in the magnitude of said threshold voltage; and
   (4) counter means for counting the number of said discrete charge packets which must be applied to said first charge storage device to change the magnitude of the voltage across said first charge storage device from said first value to a second predetermined value.

6. The analog to digital converter of claim 5, wherein said feedback circuit means comprises:
   a second MOSFET having substantially the same electrical characteristics as and maintained in substantially the same temperature as said first MOSFET, said second MOSFET having a first terminal coupled to said second charge storage device;
   means for biasing said second MOSFET into a "shelf" mode of operation such that said second MOSFET charges said second charge storage device to a value $(V_g - V_t)$ after each said charge transfer operation, wherein $V_g$ is the gate voltage of said second MOSFET and $V_t$ is the threshold voltage thereof;

said biasing means including means for adjusting the drain voltage of said second MOSFET to be substantially equal to the drain voltage of said first MOSFET whenever said biasing means biases said second MOSFET into said "shelf" mode of operation whereby the threshold voltage $V_t$ of said second MOSFET is substantially equal to the threshold voltage of said first MOSFET.

7. The charge transfer device of claim 6, wherein said first and second MOSFETS are formed in the same semiconductor substrate.

8. The charge transfer device of claim 6, wherein said gate voltage is chosen to be more negative than the sweep of the voltage across said second charge storage device and wherein said biasing means biases said second MOSFET into said "shelf" transistor mode by first precharging said first capacitor to a value which is more positive than said drain voltage of said charge transfer MOSFET and then adjusting the drain voltage of said second MOSFET to be substantially equal to the drain voltage of said first MOSFET.

9. The analog to digital converter of claim 5, wherein said means for charging said first charge storage device to a first value comprises an electronic switch.

10. The analog to digital converter of claim 5, wherein said counter means comprises:
a digitial counter for counting the number of charge packets applied to said first charge storage device; and
a comparator for disabling said digital counter when the voltage across said charge storage device reaches said predetermined value.

* * * * *